(12) United States Patent
Iida

(10) Patent No.: US 8,976,563 B2
(45) Date of Patent: Mar. 10, 2015

(54) SEMICONDUCTOR MEMORY DEVICE

(71) Applicant: Panasonic Corporation, Osaka (JP)

(72) Inventor: Masahisa Iida, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/900,282

(22) Filed: May 22, 2013

(65) Prior Publication Data

US 2013/0250646 A1 Sep. 26, 2013

Related U.S. Application Data

(63) Continuation of application No. PCT/JP2011/006804, filed on Dec. 5, 2011.

(30) Foreign Application Priority Data

Dec. 20, 2010 (JP) ................................. 2010-283402
Dec. 20, 2010 (JP) ................................. 2010-283404

(51) Int. Cl.
*G11C 5/06* (2006.01)
*G11C 7/18* (2006.01)
*G11C 7/02* (2006.01)
*G11C 11/4097* (2006.01)

(52) U.S. Cl.
CPC ...... *G11C 5/06* (2013.01); *G11C 5/066* (2013.01); *G11C 7/18* (2013.01); *G11C 7/02* (2013.01); *G11C 11/4097* (2013.01)
USPC .......................................................... 365/72

(58) Field of Classification Search
CPC ........................................................ G11C 5/06
USPC ..................................................... 365/69, 72
See application file for complete search history.

(56) References Cited

U.S. PATENT DOCUMENTS

2009/0034314 A1* 2/2009 Hirose ............................ 365/51
2009/0135639 A1* 5/2009 Hirose ............................ 365/72

FOREIGN PATENT DOCUMENTS

| JP | 61-217994 A | 9/1986 |
| JP | 63-066791 A | 3/1988 |
| JP | 06-349267 A | 12/1994 |
| JP | 09-171684 A | 6/1997 |
| JP | 2007-273851 A | 10/2007 |
| JP | 2009-033029 A | 2/2009 |

OTHER PUBLICATIONS

International Search Report issued in International Patent Application No. PCT/JP2011/006804 mailed on Mar. 13, 2012.

* cited by examiner

*Primary Examiner* — Son Mai
*Assistant Examiner* — Muna Techane
(74) *Attorney, Agent, or Firm* — McDermott Will & Emery LLP

(57) ABSTRACT

In a memory device having a hierarchical bit line architecture, a main memory array is divided into two sub-memory arrays. The number of sub bit lines is twice the number of main bit lines, and global data lines are formed in the same metal interconnect layer as the main bit lines, thereby reducing an increase in the number of interconnects used in a memory macro. Furthermore, after charge sharing of the bit lines, the global data lines are kept in a pre-charge state at the time of amplification using sense amplifiers so that the global data lines function as shields of the main bit lines. This largely reduces interference noise between adjacent main bit lines to improve operating characteristics.

10 Claims, 15 Drawing Sheets

SEMICONDUCTOR MEMORY DEVICE

CROSS-REFERENCE TO RELATED APPLICATIONS

This is a continuation of International Application No. PCT/JP2011/006804 filed on Dec. 5, 2011, which claims priority to Japanese Patent Application No. 2010-283402 filed on Dec. 20, 2010 and Japanese Patent Application No. 2010-283404 filed on Dec. 20, 2010. The entire disclosures of these applications are incorporated by reference herein.

BACKGROUND

The present disclosure relates to semiconductor memory devices, and more particularly to techniques of reducing noise and costs in dynamic random access memories (DRAMs) having a hierarchical bit line architecture. Furthermore, the present disclosure relates to techniques of reducing noise in DRAMs having a hierarchical bit line architecture in which sub bit lines are arranged in a cross-point structure.

In recent years, high integration for providing systems on chip (SoC) at low costs has particularly required in embedded DRAMs. Memory arrays including memory cells and sense amplifier arrays largely occupy the areas of memories. For high integration, miniaturization in memory cell transistors, and memory cell capacitors using high-k films has been employed to reduce the areas of memory cells themselves.

The size reduction ratio of sense amplifier arrays is becoming relatively small as compared to that of memory cell transistors. The reason is as follows. Sense amplifiers need to precisely amplify fine read signals from memories. On the other hand, the sizes of transistors forming a sense amplifier are difficult to reduce, since the reduction causes differences in the electrical characteristics of the transistors to degrade performance. It is thus necessary to increase the number of memory cells which are coupled to a single bit line, and to relatively reduce the number of sense amplifiers in a memory array in order to reduce the area of a memory. Thus, the hierarchical bit line architecture has been focused on to reduce the number of sense amplifiers in each memory array. (See Japanese Patent Publication No. H6-349267, Japanese Patent Publication No. 2007-273851, and Japanese Patent Publication No. 2009-33029.)

On the other hand, a cross-point bit line structure including memory cells at all intersections between word lines and sub bit lines may be employed for high-density integration of the memory cells. A hierarchical bit line architecture is also known, which is formed by combining a cross-point sub bit line structure with a folded main bit line structure including reference bit lines arranged separately from read bit lines to reduce noise. (See Japanese Patent Publication No. S61-217994, Japanese Patent Publication No. H9-171684, and Japanese Patent Publication No. S63-66791.)

In a DRAM having a hierarchical bit line architecture, pitches of sub bit lines in a miniaturizing process are close to the limit in processing. For example, if sub bit lines are formed in a first metal interconnect, main bit lines are formed in a second metal interconnect, which is higher than the first metal interconnect, shunt interconnects of word lines are formed in a third metal interconnect, and global data lines are formed in a fourth metal interconnect.

The number of memory cells, which can be coupled to a single bit line, is determined by the magnitude of a potential difference (i.e., a sensing signal) $\Delta V$ caused between the bit line and a complementary bit line when data in a memory cell is read on the bit line. The potential difference $\Delta V$ is expressed by the following equation.

$$|\Delta V| = (Vdd/2)/((Cbl+Cbm)/Cs+1)$$

In the equation, Vdd represents the power supply voltage of an array, Cbm represents the parasitic capacitance of a main bit line, Cbl represents the parasitic capacitance of a sub bit line, and Cs is the capacitance of a memory cell capacitor. Assume that the hierarchical bit line architecture includes a single main bit line and N sub bit lines, where N is an integer of two or more, which are formed at a lower level than the main bit line. If the expression $Cbm<N \times Cbl$ is satisfied, the number of memory cells in each bit line increases N-fold (i.e., the number of the sense amplifiers decreases 1/N-fold), and, at the same time, a sensing signal is greater than that in a non-hierarchical bit line architecture.

In a stacked capacitor DRAM, Cbm is the sum of the parasitic capacitance between a main bit line and a normal surrounding interconnect conductor, and the gate capacitance of a sense amplifier. On the other hand, Cbl additionally includes the parasitic capacitance between an upper electrode and a lower electrode of a memory cell capacitor, which are formed close to the limit under a particular process rule, the junction capacitance of a memory cell transistor, and the overlap capacitance with a word line. As a result, the expression $Cbm<Cbl$ is obtained. Furthermore, the process for a shrinked sub-100-nm embedded DRAM includes the conditions satisfying the expression $Cbm<N \times Cbl$. With the use of a hierarchical bit line architecture, a sensing signal capable of stable operation is obtained while reducing the number of the sense amplifiers.

SUMMARY

In a conventional hierarchical bit line architecture, since main bit lines, which are arranged at same interconnect pitches as sub bit lines, need to be formed in a higher metal interconnect, the total number of the interconnect layers used in a DRAM macro increases. In general, signal interconnects and power supply interconnects used by an analog logic section are used through higher metal interconnect regions of an embedded DRAM macro in a SoC. Thus, with an increase in the number of the interconnect layers used in an embedded DRAM, the total number of the interconnect layers in the entire SoC increases, thereby increasing the costs. Also, the number of interconnects passing over the DRAM macro decreases, thereby increasing the distance for drawing the signal interconnects and the power supply interconnects of the analog logic section. This causes degradation in performance such as an increase in signal delay, power supply drop, and noise.

As compared to a folded bit line structure, in which read bit lines and reference bit lines are alternately arranged, adjacent bit lines are all read bit lines in a cross-point bit line structure. This configuration increases interference noise between pairs of adjacent bit lines from a coupling capacitor, and reduces cancellation of in-phase noise, which is canceled in folded bit lines. This causes degradation in sensing signals.

In a folded main bit line structure, the bit line length viewed from a sense amplifier changes depending on a sub bit line region to be accessed. Thus, bit line twist cannot be utilized, which is known as a technique of effectively reducing interference between adjacent bit lines in read and sense operation to improve the operating margin. The folded main bit line structure receives great interference noise from the adjacent main bit lines. The bit line twist represents the state in which the arrangement order is changed in one or more positions, and two or more bit lines are twisted.

In view of the problem, the present disclosure provides a hierarchical bit line architecture reducing an increase in the number of interconnect layers, and a technique of reducing degradation in operating characteristics which is caused by interference noise between main bit lines.

It is an objective of the present disclosure to provide a technique of reducing bit line noise in a semiconductor memory device having a hierarchical bit line architecture of cross-point sub bit lines, thereby improving read and sense operating characteristics.

In order to achieve the objective, in the present disclosure, a main memory array is divided into two sub-memory arrays, and the number of sub bit lines is twice the number of main bit lines, thereby enlarging the pitches of the main bit lines to twice the pitches of the sub bit lines. Utilizing this configuration, the present disclosure provides a hierarchical bit line architecture by arranging global data lines between main bit lines without increasing the number of interconnect layers.

Specifically, the present disclosure provides a semiconductor memory device having a hierarchical bit line architecture. The device includes a first sub-memory array including a plurality of memory cells coupled in common to first sub bit lines; a second sub-memory array including a plurality of memory cells coupled in common to second sub bit lines; main bit lines, each being coupled to one of the first sub bit lines via a first switching transistor, and to one of the second sub bit lines via a second switching transistor; and global data lines coupled to the main bit lines via sense amplifiers. A total number of the first sub bit lines and the second sub bit lines is twice a number of the main bit lines. The main bit lines and the global data lines are formed in a same interconnect layer, which is higher than an interconnect layer of the first and second sub bit lines.

According to the present disclosure, the global data lines and the main bit lines are formed in the same interconnect layer, thereby providing a hierarchical bit line architecture without increasing the number of the interconnect layers. Furthermore, the global data lines, each of which is arranged between a pair of the main bit lines, are kept in a pre-charge state while reading a bit line or amplifying with a sense amplifier. This allows the global data lines to function as shields of the main bit lines, thereby reducing the interference noise between the adjacent main bit lines.

In the present disclosure, two sub-memory arrays being cross-point sub bit line structures form a main memory array, and the number of the sub bit lines is twice the number of the main bit lines, thereby enlarging the pitches of the main bit lines to twice the pitches of the sub bit lines. Utilizing this configuration, reference bit lines, global data lines, or memory cell plate shunt interconnects, which are twisted in a folded main bit line structure, are arranged between the main bit lines. This reduces unique noise to sub bit lines in a cross-point structure, and interference noise between the bit lines from adjacent sense amplifiers.

Specifically, according to an aspect, the present disclosure provides a semiconductor memory device having a hierarchical bit line architecture. The device includes a first sub-memory array including a plurality of memory cells coupled in common to first sub bit lines in a cross-point manner; a second sub-memory array including a plurality of memory cells coupled in common to second sub bit lines in a cross-point manner; main bit lines, each being coupled to one of the first sub bit lines via a first switching transistor, and to one of the second sub bit lines via a second switching transistor; and sense amplifiers coupled to the main bit lines such that the main bit lines are arranged in a folded bit line structure. A total number of the first sub bit lines and the second sub bit lines is twice a number of the main bit lines. Each of the main bit lines extends, as a reference bit line, over the sense amplifiers to another memory array and is twisted at a portion together with another main bit line in any position.

According to another aspect, the present disclosure provides a semiconductor memory device having a hierarchical bit line architecture. The device includes a first sub-memory array including a plurality of memory cells coupled in common to first sub bit lines in a cross-point manner; a second sub-memory array including a plurality of memory cells coupled in common to second sub bit lines in a cross-point manner; main bit lines, each being coupled to one of the first sub bit lines via a first switching transistor, and to one of the second sub bit lines via a second switching transistor; sense amplifiers coupled to the main bit lines such that the main bit lines are arranged in a folded bit line structure; and global data lines coupled to the main bit lines via the sense amplifiers. A total number of the first sub bit lines and the second sub bit lines is twice a number of the main bit lines. The main bit lines and the global data lines are alternately formed adjacent to each other in a same interconnect layer, which is higher than an interconnect layer of the first and second sub bit lines.

According to a still another aspect, the present disclosure provides a semiconductor memory device having a hierarchical bit line architecture. The device includes a first sub-memory array including a plurality of memory cells coupled in common to first sub bit lines in a cross-point manner; a second sub-memory array including a plurality of memory cells coupled in common to second sub bit lines in a cross-point manner; main bit lines, each being coupled to one of the first sub bit lines via a first switching transistor, and to one of the second sub bit lines via a second switching transistor; sense amplifiers coupled to the main bit lines such that the main bit lines are arranged in a folded bit line structure; and memory cell plate shunt interconnects coupled in common to the memory cells in the first and second sub-memory arrays. A total number of the first sub bit lines and the second sub bit lines is twice a number of the main bit lines. The main bit lines and the memory cell plate shunt interconnects are alternately formed adjacent to each other in a same interconnect layer, which is higher than an interconnect layer of the first and second sub bit lines.

The present disclosure provides a hierarchical bit line architecture without increasing the number of interconnect layers, and a technique of reducing degradation in operating characteristics due to interference noise between main bit lines.

The present disclosure provides a technique of reducing bit line noise in a semiconductor memory device having a hierarchical bit line architecture of cross-point sub bit lines, thereby improving read and sense operating characteristics.

DETAILED DESCRIPTION

Embodiments of the present disclosure will be described hereinafter with reference to the drawings.

First Embodiment

Figure 1:
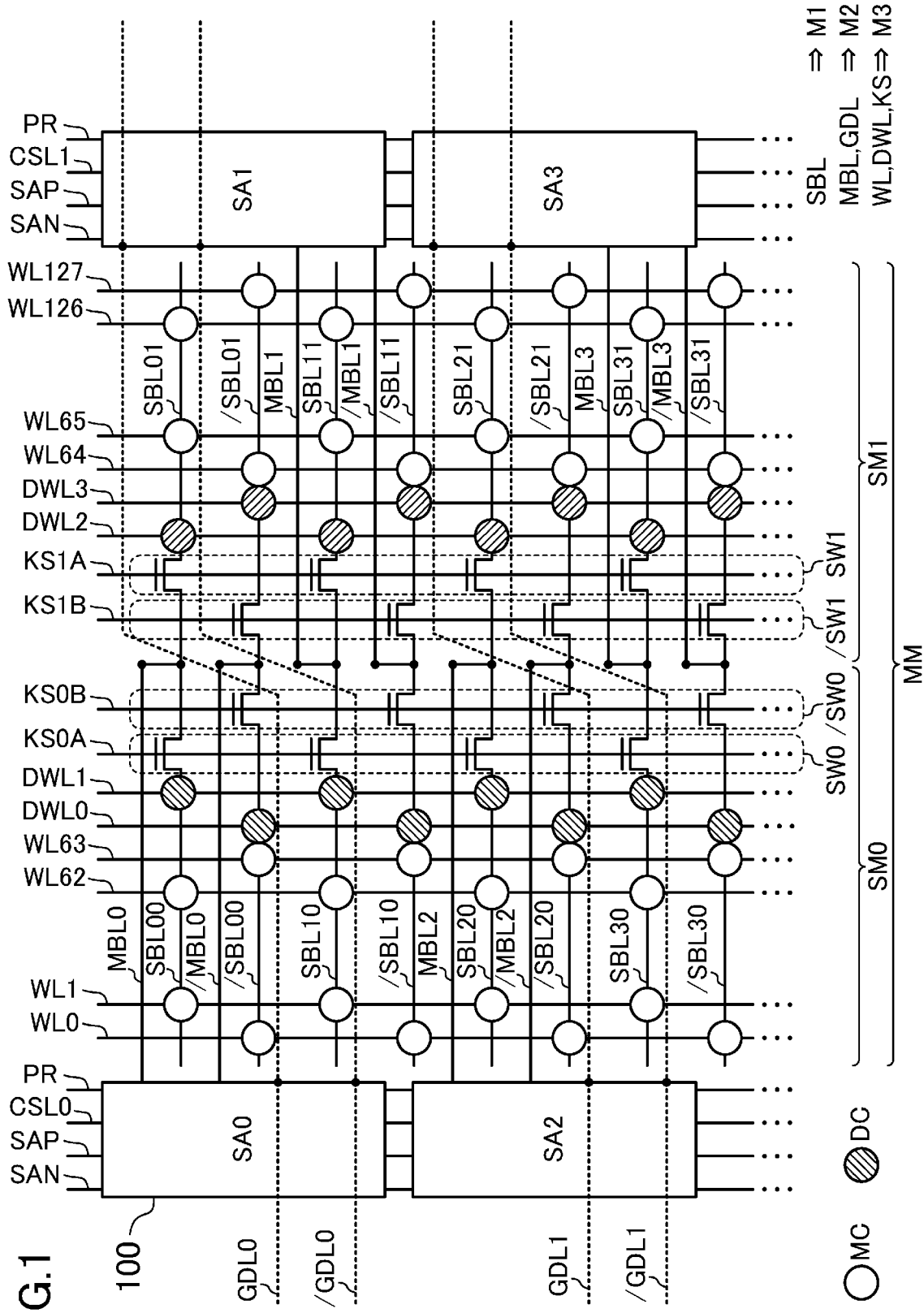
FIG. 1 is a circuit diagram of a semiconductor memory device according to a first embodiment of the present disclosure.

FIG. 1 illustrates the circuit configuration of a semiconductor memory device according to a first embodiment of the present disclosure. A main memory array MM includes two sub-memory arrays SM0 and SM1. Bit lines receiving and outputting memory data form a hierarchical bit line architecture. The architecture includes, for example, a common main bit line MBL0 (and /MBL0) shared by the two sub-memory arrays SM0 and SM1, and sub bit lines SBL00 and SBL01 (and /SBL00 and /SBL01) corresponding to the sub-memory arrays SM0 and SM1, respectively. The bit lines are arranged in a folded bit line structure.

A section of a sub-memory array SM0 storing first- and second-bit data will be described below as a representative. Memory cells MCs, each of which stores 1-bit data, are arranged at the intersections between two of every four of word lines WL0-WL63 and a sub bit line SBL00 or a sub bit line/SBL00 to correspond to each other, thereby forming the folded bit line structure. Specifically, the memory cells MCs are arranged at the intersections between word lines WL0, WL3, WL4, WL7, WL8, . . . , WL59, WL60, WL63 and the sub bit line/SBL00, and at the intersections between word lines WL1, WL2, WL5, WL6, . . . , WL61, WL62 and the sub bit line SBL00 to correspond to each other. Around the boundary between the sub-memory arrays SM0 and SM1, a pair of dummy word lines DWL0 and DWL1, and a pair of dummy word lines DWL2 and DWL3 are provided between the word lines WL and bit line selection lines KS in the sub-memory arrays SM0 and SM1, respectively. The dummy word lines are coupled to dummy memory cells DC. The dummy memory cells DC are memory cell transistors without a memory cell capacitor, and keep the layout pattern uniform.

The main bit lines MBL0 and /MBL0 are coupled to a sense amplifier (SA0) 100, which is coupled to an n-channel sense amplifier control signal line SAN, a p-channel sense amplifier control signal line SAP, a column selection signal line CSL0, and a pre-charge control signal line PR. The sense amplifier 100 amplifies the potential difference between the pair of the main bit lines, which is caused depending on memory data in each memory cell MC.

The sub bit lines SBL are formed in a first metal interconnect M1, and the main bit lines MBL are formed in a second metal interconnect M2. Pairs of main bit lines MBL and pairs of global data lines GDL are alternately arranged in the same interconnect layer. Shunt interconnects of the word lines WL, the dummy word lines DWL, and the bit line selection lines KS are formed in a third metal interconnect M3. Bit line selection switches SW0, /SW0, SW1, and /SW1 are transistors controlled by bit line selection lines KS0A, KS0B, KS1A, and KS1B, respectively.

Figure 2:
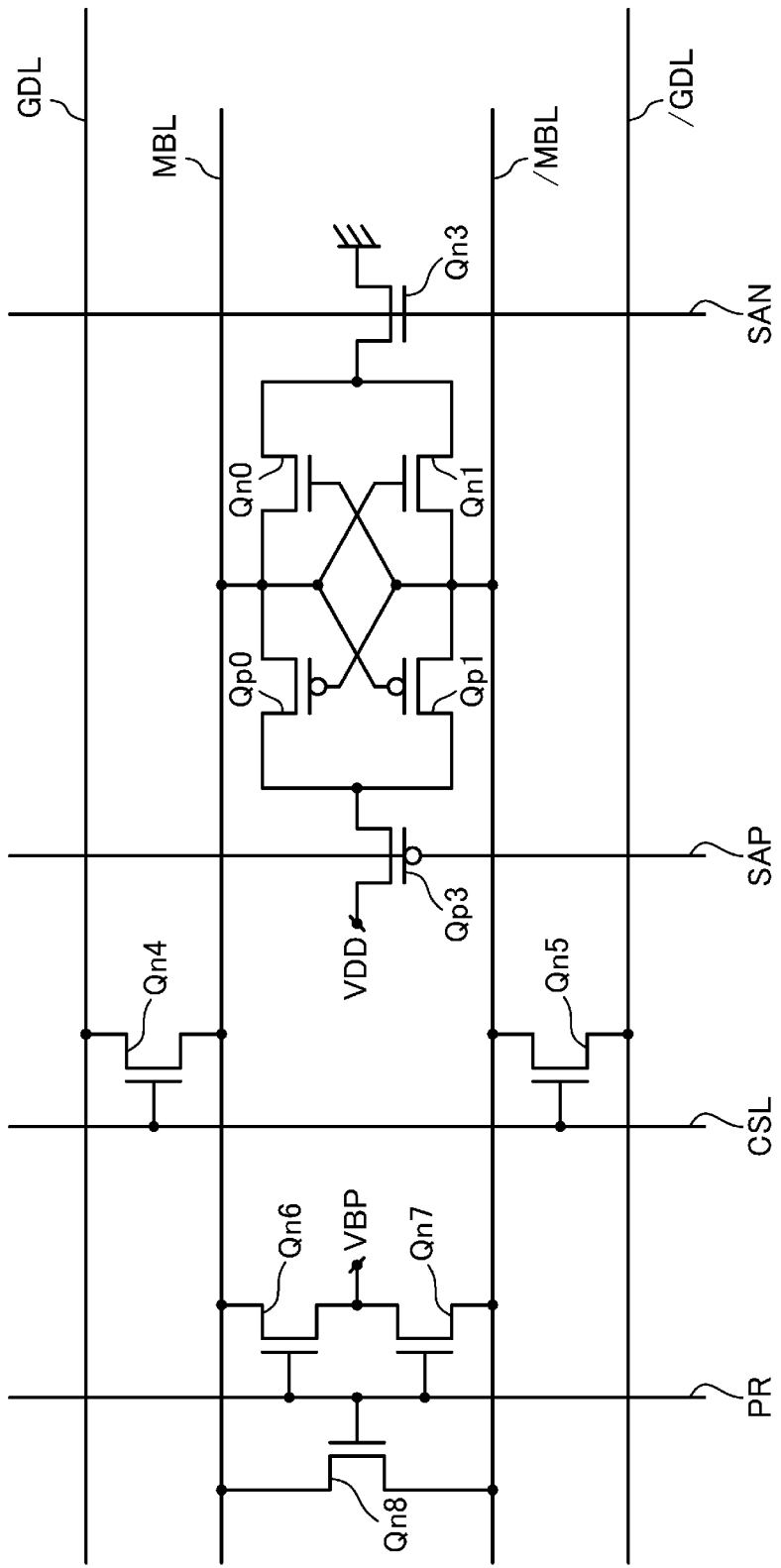
FIG. 2 is a circuit diagram illustrating a detailed example configuration of a sense amplifier in FIG. 1.

FIG. 2 illustrates the configuration of each sense amplifier 100. The sense amplifier 100 includes NMOS transistors Qn0, Qn1, and Qn3, and PMOS transistors Qp0, Qp1, and Qp3. A pair of main bit lines MBL and /MBL and a pair of global data lines GDL and /GDL are coupled together via column selection NMOS transistors Qn4 and Qn5, and are pre-charged/equalized to a bit line pre-charge voltage VBP via NMOS transistors Qn6, Qn7, and Qn8.

Figure 3:
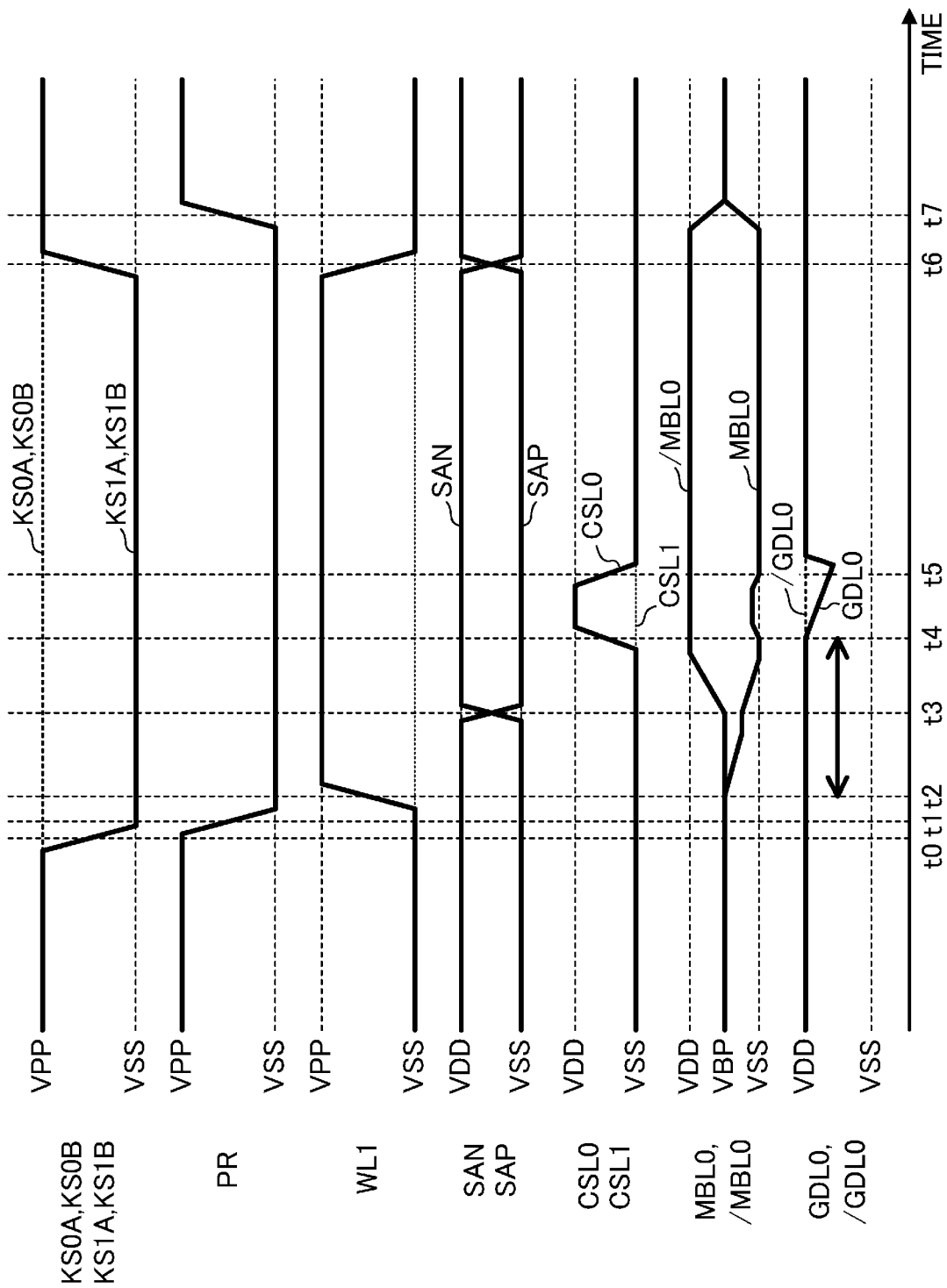
FIG. 3 illustrates timing of read operation of the semiconductor memory device of FIG. 1.

Next, memory operation will be described with reference to FIG. 3. VDD represents an array voltage, VPP represents a boosting voltage, and VSS represents a ground voltage. First, at a time t0, VSS is applied to KS1A and KS1B, which are other than the bit line selection lines KS0A and KS0B coupling the sub bit lines to the main bit lines of the sub-memory array SM0 to be accessed. Then, at a time t1, VSS is applied to the pre-charge control signal line PR to stop the pre-charge of the bit lines. At a time t2, VPP is applied to the word line WL1 to read data on the bit lines from a memory cell capacitor (hereinafter referred to as charge sharing). After that, at a time t3 when the charge sharing is complete, VDD is applied to the n-channel sense amplifier control signal line SAN, and VSS is applied to the p-channel sense amplifier control signal line SAP to start amplification by the sense amplifiers, thereby fully vibrating the bit lines. Next, for example, in read operation, the global data lines GDL0 and /GDL0 shift from a pre-charge state to a floating state at a time t4. At the same time, VDD is applied to the column selection signal line CSL0 to read the data in the main bit lines MBL0 and /MBL0 on the global data lines GDL0 and /GDL0. Then, a read amplifier (not shown) amplifies and reads a signal voltage difference between the pair of the global data lines. At a time t5, VSS is applied to the column selection signal line CSL0 to pre-charge the global data lines GDL0 and /GDL0 to VDD. Furthermore, at a time t6, VSS is applied to the word line WL1 and the n-channel sense amplifier control signal line SAN, and VDD is applied to the p-channel sense amplifier control signal line SAP to turn off the sense amplifier 100. VPP is applied to all the bit line selection lines KS0A, KS0B, KS1A, and KS1B. After that, at a time t7, VPP is applied to the pre-charge control signal line PR to pre-charge the main bit lines and the sub bit lines.

By employing this embodiment to form the global data lines and the main bit lines in the same interconnect layer, the hierarchical bit line architecture is implemented without increasing the number of the interconnect layers. In addition, the pair of global data lines, which is pre-charged to VDD in the period between t2 and t4, i.e., between the start of the reading and the amplification by the sense amplifier, serves as shield wires of the main bit lines, thereby reducing interference noise between the adjacent main bit lines.

First Variation of First Embodiment

Figure 4:
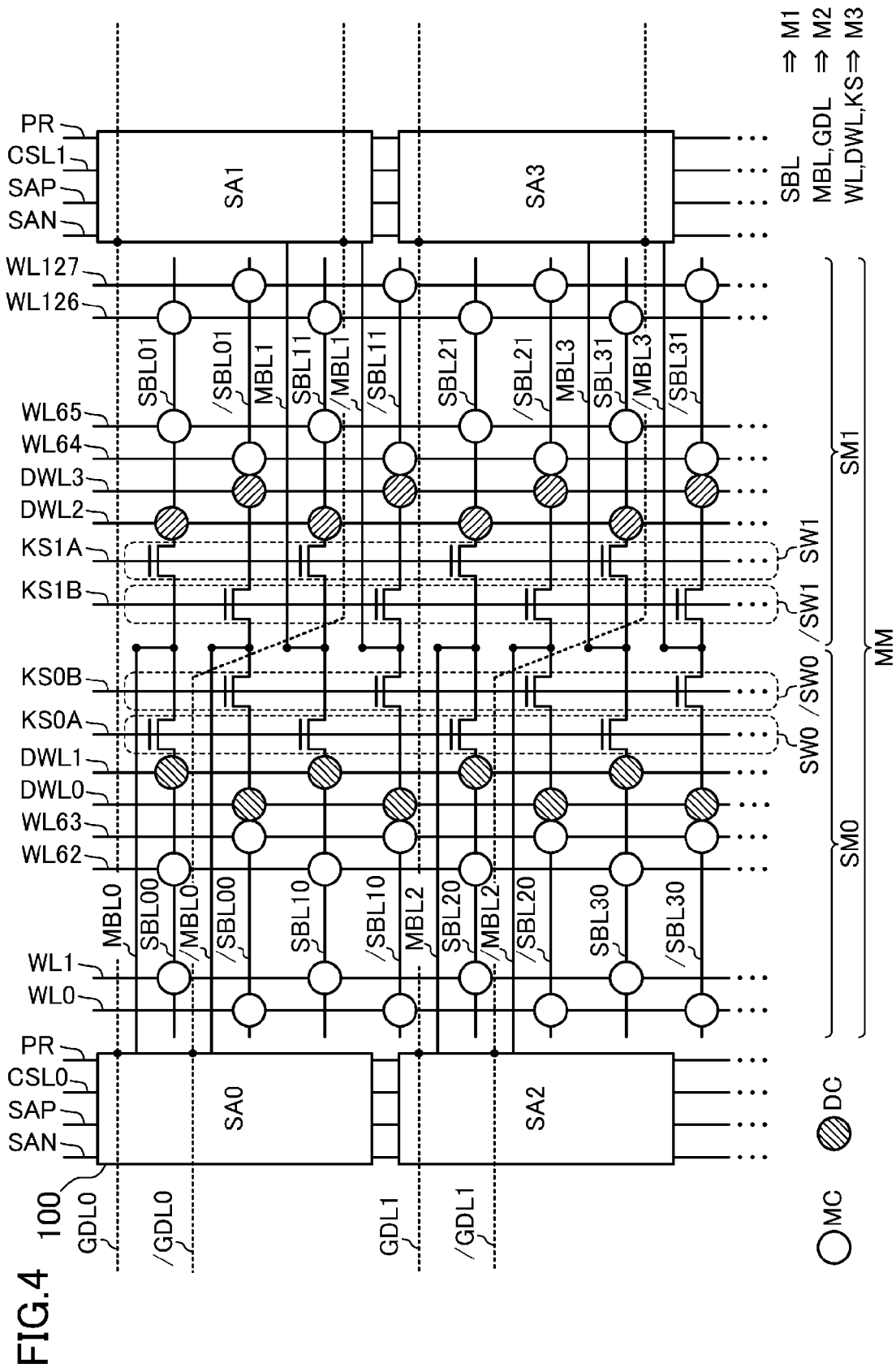
FIG. 4 is a circuit diagram of a semiconductor memory device according to a first variation of the first embodiment.

FIG. 4 illustrates the circuit configuration of a semiconductor memory device according to a first variation of the first embodiment. Different from the first embodiment shown in FIG. 1, a global data line GDL is provided between each pair of individual main bit lines MBL.

In the first embodiment, no global data line is provided between each pair of complementary main bit lines MBL0 and /MBL0, and thus, noise caused by the coupling capacitor between the pair of the main bit lines in read/sense operation and influences the memory device. On the other hand, the first variation of the first embodiment completely shields noise between the main bit lines, thereby further improving the operating characteristics.

Second Variation of First Embodiment

Figure 5:
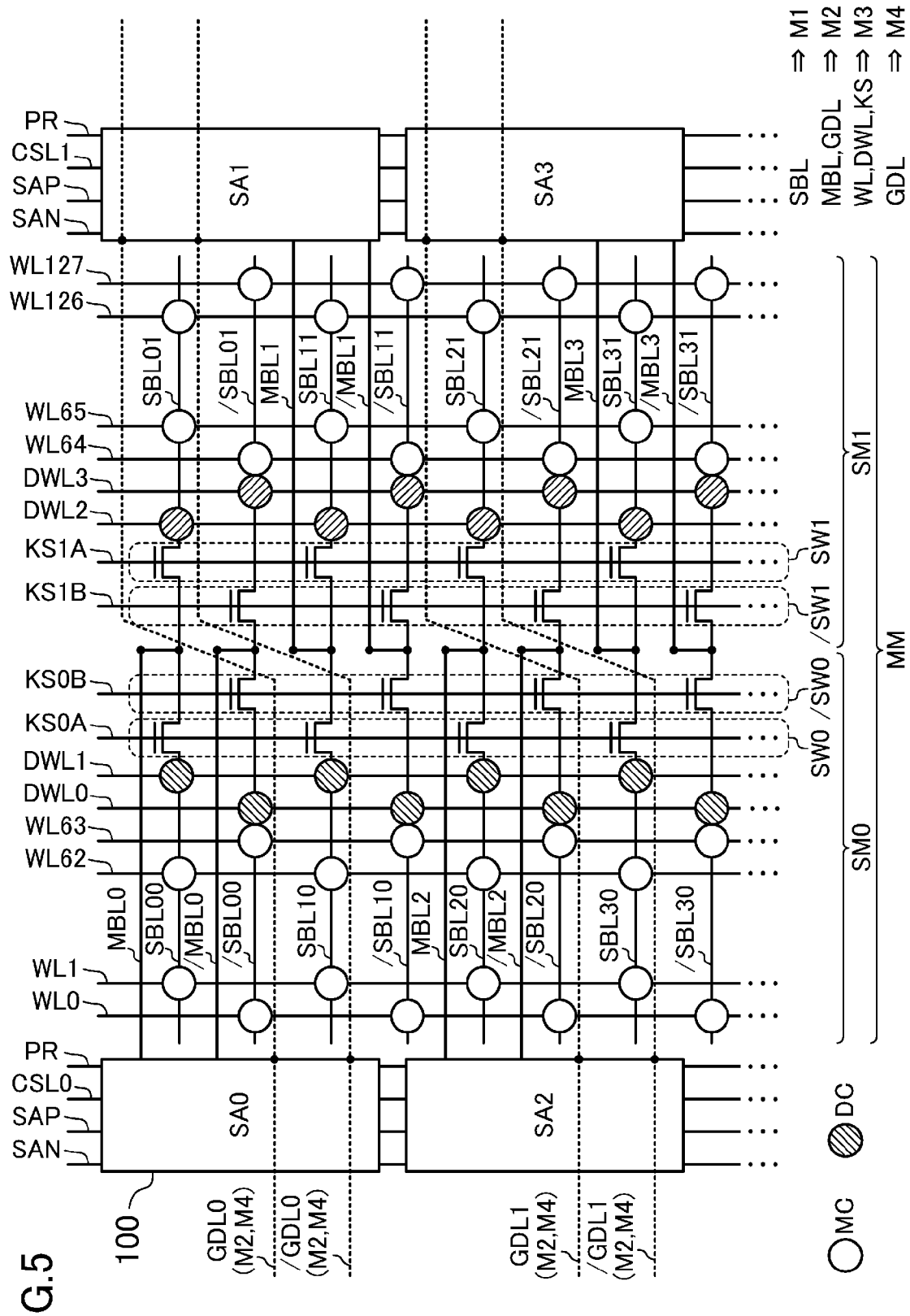
FIG. 5 is a circuit diagram of a semiconductor memory device according to a second variation of the first embodiment.

FIG. 5 illustrates the circuit configuration of a semiconductor memory device according to a second variation of the first embodiment. Different from the first embodiment shown in FIG. 1, global data lines GDL are arranged at two levels, the second and fourth metal interconnects M2 and M4, thereby reducing the resistance of the global data lines GDL.

Figure 6:
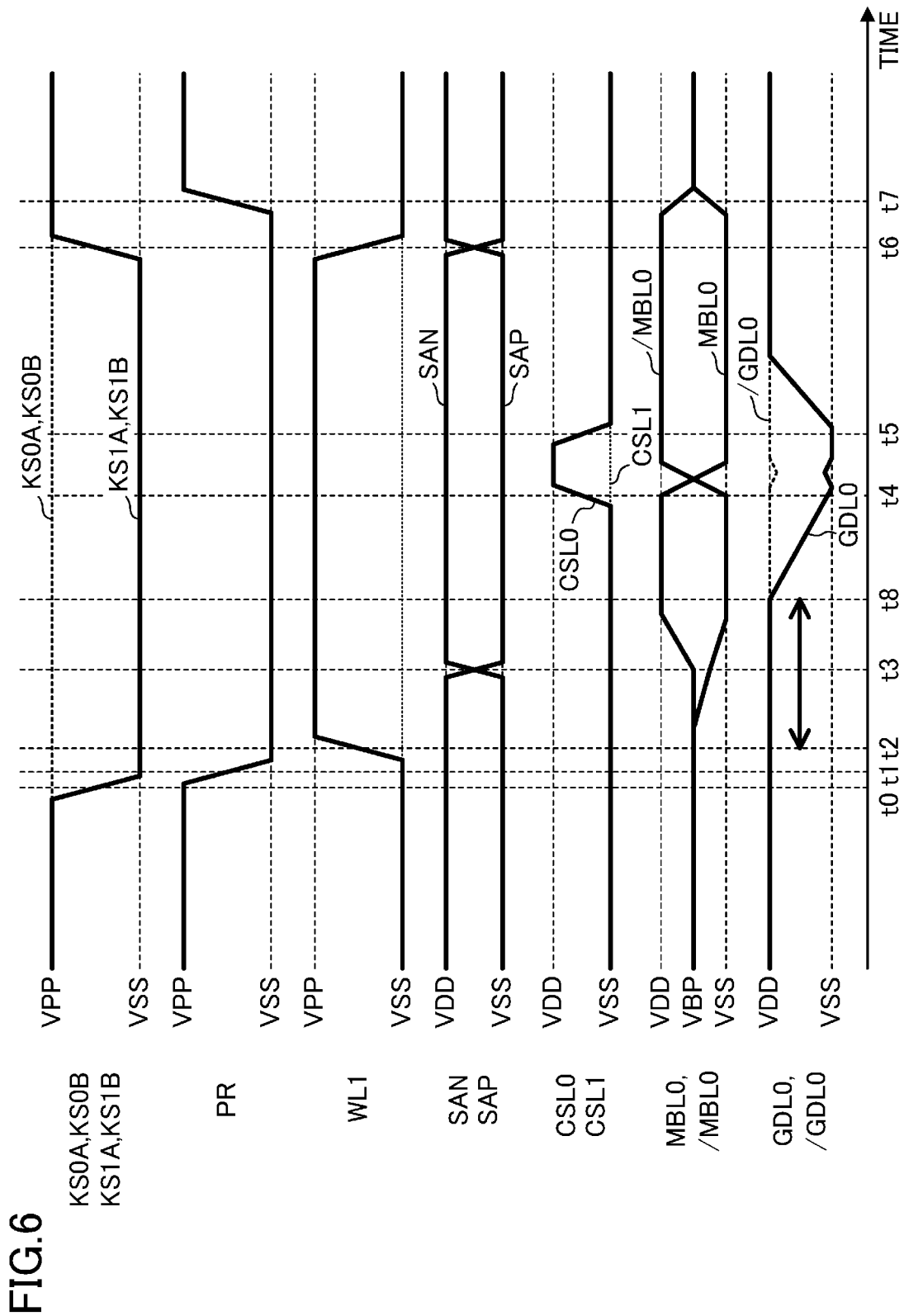
FIG. 6 illustrates timing of write operation of the semiconductor memory device of FIG. 5.

Next, memory operation will be described with reference to FIG. 6. While FIG. 3 illustrates read operation, FIG. 6 illustrates write operation. Different from FIG. 3, after the pre-charge of the global data lines GDL0 and /GDL0 ends at a time t8, before the time t4 when the column selection signal line CSL0 is activated, a write buffer (not shown) drives the global data lines GDL0 and /GDL0. In the period between t2 and t8 when the bit line performs read/sense operation, since the global data lines GDL0 and /GDL0 are pre-charged, the global data lines GDL0 and /GDL0 operate as the shields between the main bit lines MBL0 and MBL0, thereby reducing noise between the bit lines.

By employing this embodiment to reduce the resistance of the global data lines GDL, the drive time of the global data lines by the write buffer is shortened to reduce the time between time t8 and the time t4. This enables higher speed memory operation.

Third Variation of First Embodiment

Figure 7:
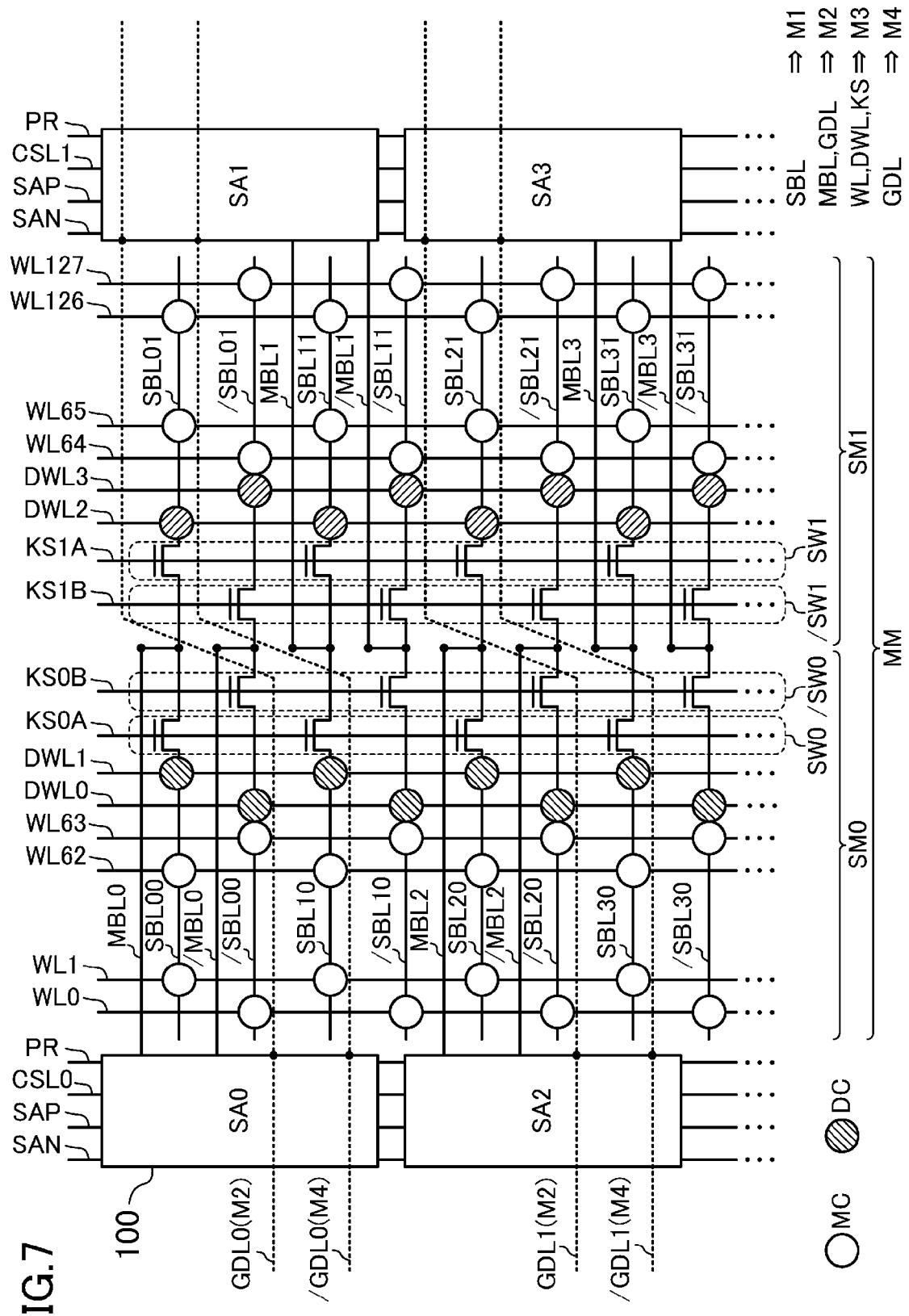
FIG. 7 is a circuit diagram of a semiconductor memory device according to a third variation of the first embodiment.

FIG. 7 illustrates the circuit configuration of a semiconductor memory device according to a third variation of the first embodiment. Different from the first embodiment shown in FIG. 1, global data lines GDL are separately formed in the second and fourth metal interconnects M2 and M4, thereby enlarging the pitches of the global data lines GDL.

By employing this embodiment to reduce the parasitic capacitance of the global data lines GDL, the drive time of the global data lines in read operation and write operation is shortened. This enables higher speed memory operation.

Fourth Variation of First Embodiment

Figure 8:
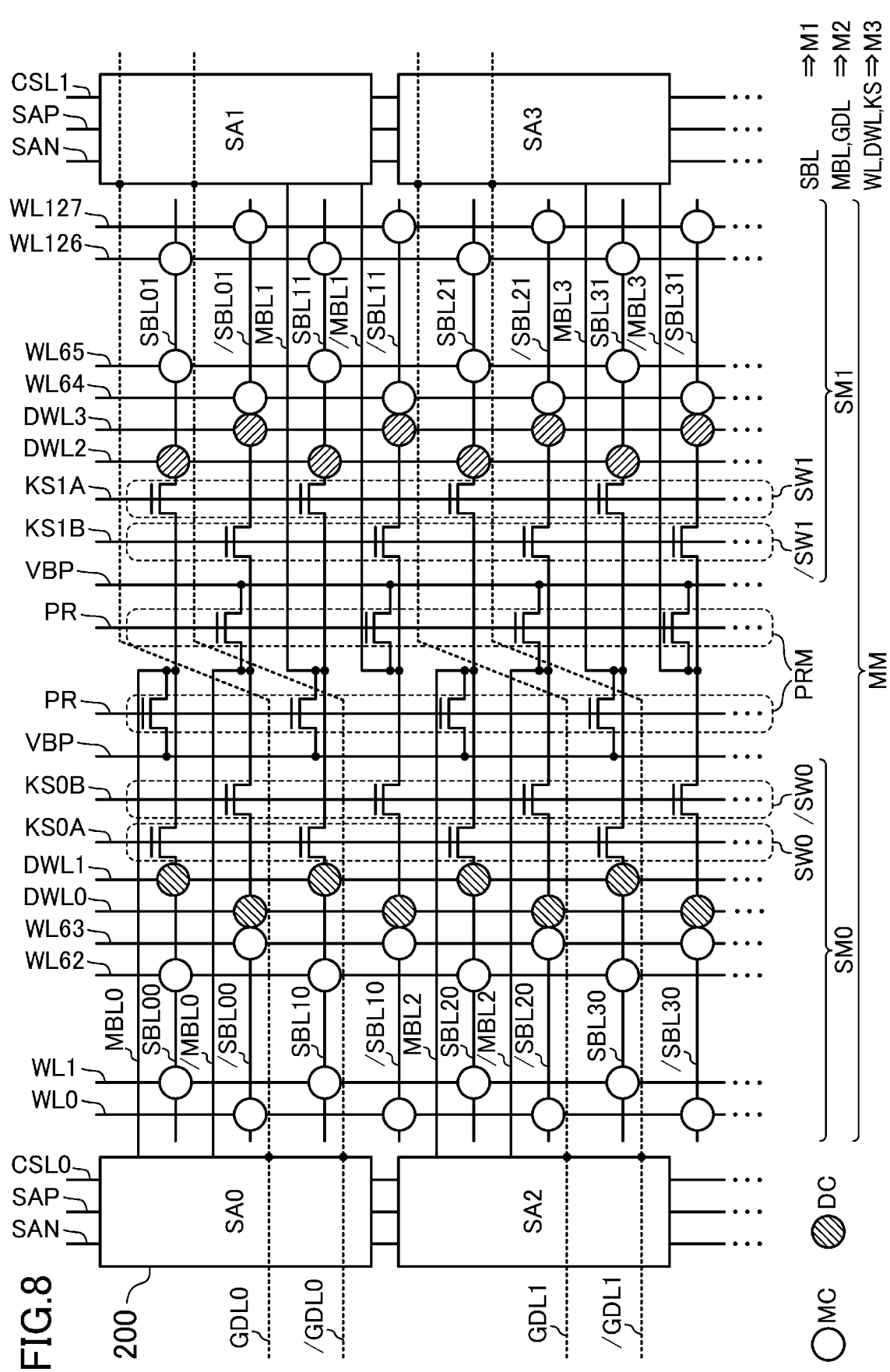
FIG. 8 is a circuit diagram of a semiconductor memory device according to a fourth variation of the first embodiment.

FIG. 8 illustrates the circuit configuration of a semiconductor memory device according to a fourth variation of the first embodiment. Different from the first embodiment shown in FIG. 1, pre-charge transistors PRM are arranged at the boundary between sub-memory arrays SM0 and SM1, and each sense amplifier 200 does not include a pre-charge/equalizing transistor.

By employing this embodiment to provide each pre-charge transistor PRM around the boundary between a pair of a main bit line MBL and a sub bit line SBL, the interconnect resistance between each pre-charge transistor PRM and the ends of the main and sub bit lines is reduced. This enables higher speed pre-charge. By using memory cell transistors as the pre-charge transistors PRM, the area is further reduced.

While in the variation shown in FIG. 8, equalizing transistors are not shown, equalizing transistors may be arranged at the boundary between the sub-memory arrays SM0 and SM1 or in the sense amplifier 200.

Second Embodiment

Figure 9:
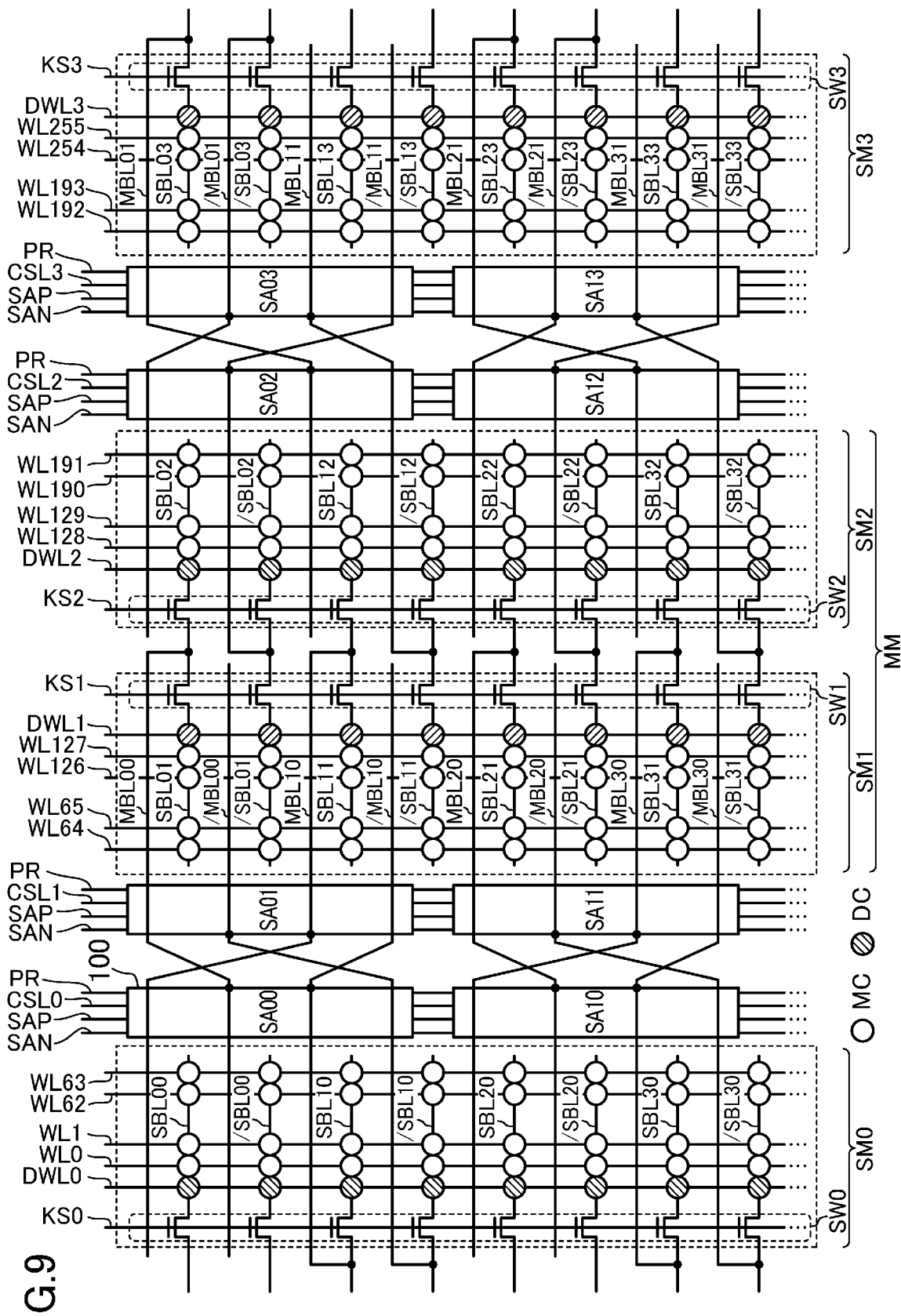
FIG. 9 is a circuit diagram of a semiconductor memory device according to a second embodiment of the present disclosure.

FIG. 9 illustrates the circuit configuration of a semiconductor memory device according to a second embodiment of the present disclosure. A main memory array MM includes two sub-memory arrays SM1 and SM2 of four sub-memory arrays SM0-SM3. The sub-memory array SM0 belongs to a main memory array adjacent to the main memory array MM at the left, and the sub-memory array SM3 belongs to a main memory array adjacent to the main memory array MM at the right.

Bit lines receiving and outputting memory data form a hierarchical bit line architecture, which includes, for example, a common main bit line MBL00 (and /MBL10) shared by the two sub-memory arrays SM0 and SM1, and sub bit lines SBL01 and SBL02 (and SBL10 and another sub bit line SBL1-1 (not shown)) corresponding to the sub-memory arrays SM1 and SM2. The sub bit lines are arranged in a cross-point bit line structure, and the main bit lines are arranged in a folded bit line structure.

For example, memory cells MCs, each of which stores 1-bit data, are arranged at the intersections between each of word lines WL64-WL127 and a sub bit line SBL01 or a sub bit line/SBL01 to correspond to each other. Also, a dummy word line DWL is provided between the word lines WL and a bit line selection line KS of each sub-memory array, and is coupled to dummy memory cells DC. The dummy memory cells DC are memory cell transistors without a memory cell capacitor, and keep the layout pattern uniform.

The sub bit lines are coupled to the main bit lines via bit line selection switches SW0-SW3 controlled by bit line selection lines KS0-KS3. When, for example, the word line WL64 is activated, the bit line selection line KS 1 is activated so that a signal read by the sub bit line SBL01 is read by the main bit line MBL00 and is amplified by a sense amplifier (SA00) 100 using another main bit line /MBL10 as a reference bit line. Similarly, a signal read by the sub bit line /SBL01 is read by the main bit line /MBL11, and is amplified by a sense amplifier (SA02) 100 using another main bit line MBL01 as a reference bit line. The configuration of the sense amplifiers 100 is similar to that of FIG. 2.

The main bit lines MBL are formed around the sense amplifiers 100 in the horizontal direction. Each of the main bit lines MBL is twisted at one intersection with another main bit line MBL in the sense amplifier region. The main bit lines MBL are coupled to the sense amplifiers 100, each of which is coupled to an n-channel sense amplifier control signal line SAN, a p-channel sense amplifier control signal line SAP, one of column selection signal lines CSL0-CSL3, and a pre-charge control signal line PR. Then, the sense amplifiers 100 amplify potential differences between the main bit lines, which is caused depending on the memory data in the memory cells MC.

The sub bit lines SBL are formed in a first metal interconnect. The main bit lines MBL are formed in a second metal interconnect. Shunt interconnects of the word lines WL, the dummy word lines DWL, and the bit line selection lines KS are formed in a third metal interconnect. The global data lines GDL (not shown) are formed in a fourth metal interconnect.

Figure 10:
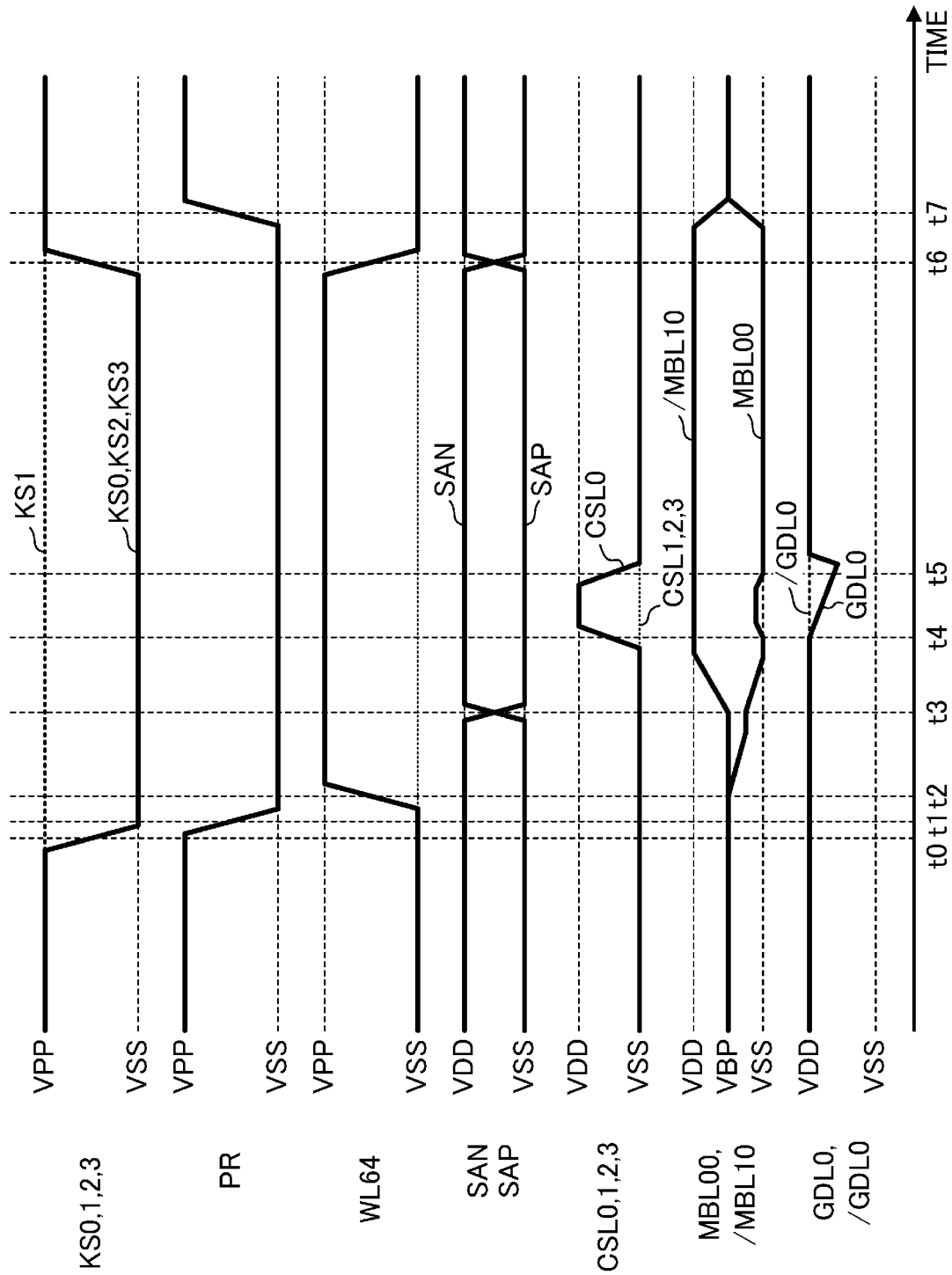
FIG. 10 illustrates timing of read operation of the semiconductor memory device of FIG. 9.

Next, memory operation will be described with reference to FIG. 10. First, at a time t0, VSS is applied to KS0, and KS2-KS3, which are other than the bit line selection line KS1 coupling the sub bit lines to the main bit lines of the sub-memory array SM1 to be accessed. Then, at a time t1, VSS is applied to the pre-charge control signal line PR to stop the pre-charge of the bit lines. At a time t2, VPP is applied to the word line WL64 to read data on the bit lines from a memory cell capacitor (hereinafter referred to as charge sharing). After that, at a time t3 when the charge sharing is complete, VDD is applied to the n-channel sense amplifier control signal line SAN, and VSS is applied to the p-channel sense amplifier control signal line SAP to start amplification by the sense amplifiers, thereby fully vibrating the bit lines. Next, for example, in read operation, the global data lines GDL0 and /GDL0 shift from a pre-charge state to a floating state at a time t4. At the same time, VDD is applied to the column selection signal line CSL0 to read the data in the main bit lines MBL00 and /MBL10 on the global data lines GDL0 and /GDL0. Then, a read amplifier (not shown) amplifies and reads a signal voltage difference between the pair of the global data lines. At a time t5, VSS is applied to the column selection signal line CSL0 to pre-charge the global data lines GDL0 and /GDL0 to VDD. Furthermore, at a time t6, VSS is applied to the word line WL64 and the n-channel sense amplifier control signal line SAN, and VDD is applied to the p-channel sense amplifier control signal line SAP to turn off the sense amplifier 100. VPP is applied to all the bit line selection lines KS0-KS3. After that, at a time t7, VPP is applied to the pre-charge control signal line PR to pre-charge the main bit lines and the sub bit lines.

According to this embodiment, while the sub bit lines are arranged in the cross-point structure, the main bit lines are twisted to effectively reduce the interference between the adjacent bit lines in read and sense operation, thereby improving the operating margin. In general, in a memory array, processing is increasingly facilitated by forming uniform cell layout to densely arrange memory cells, thereby causing a disadvantage in area reduction such as a need for extra dummy memory cells when forming the bit line twist. On the other hand, in this embodiment, the bit line twist is formed in the sense amplifier region under less severe layout constraint of the upper interconnect layer than the memory array region, thereby providing the bit line twist without causing any disadvantage in the area reduction.

First Variation of Second Embodiment

Figure 11:
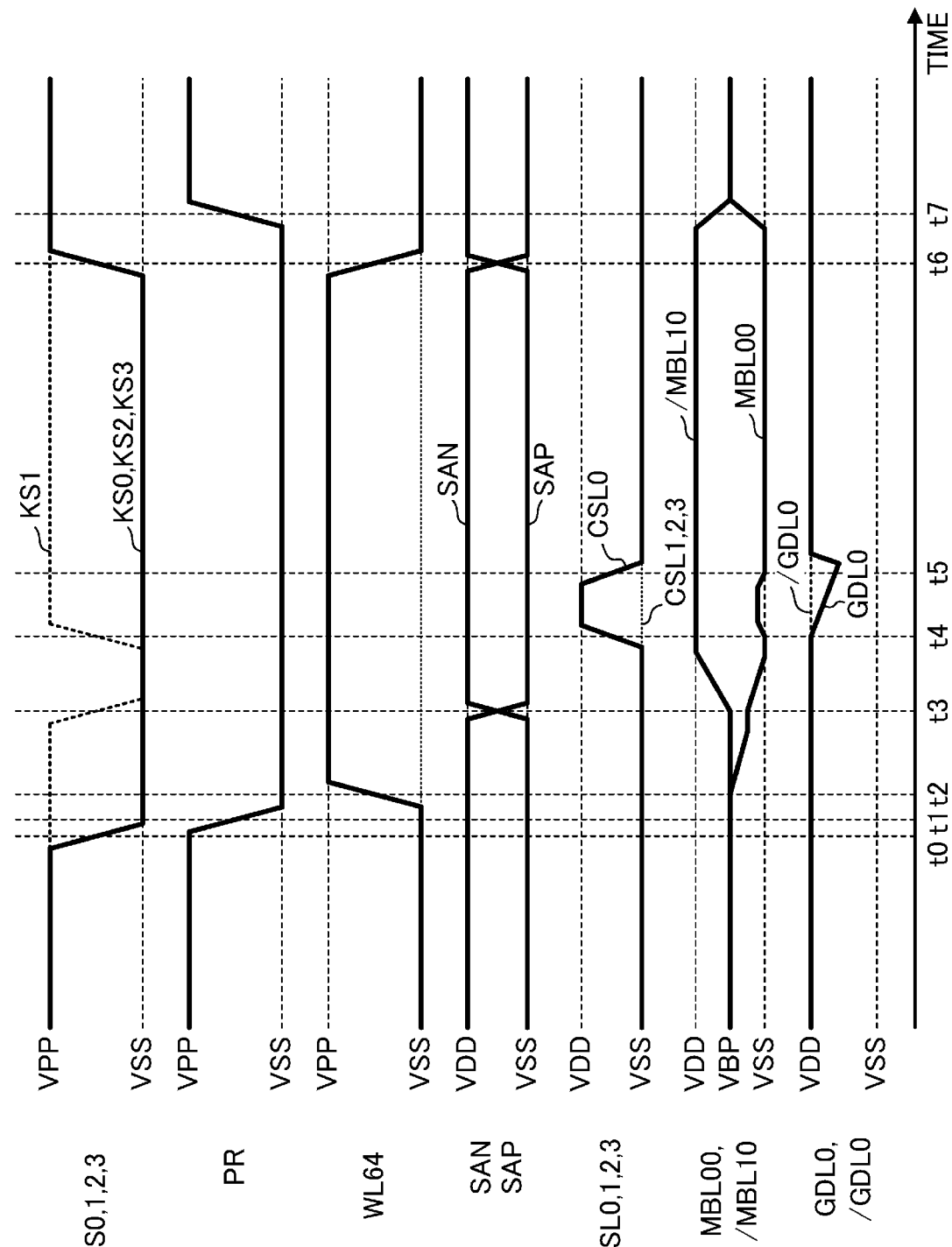
FIG. 11 illustrates timing of read operation of a semiconductor memory device according to a first variation of the second embodiment.

FIG. 11 illustrates the timing of a control signal according to a first variation of the second embodiment. Different from the second embodiment shown in FIG. 10, VSS is once applied to the bit line selection line KS1 of the sub-memory array SM1 being accessed, at the time t3 of activating the sense amplifier to turn off the bit line selection switch SW1. Then, VPP is applied to the bit line selection line KS 1, for example, at the time t4 of coupling the column switch after the sense amplification to turn on the bit line selection switch SW1.

In this variation, the bit line selection switch SW1 is turned off in the sense amplification to cut off the sub bit line SBL01, thereby reducing the total apparent parasitic capacitance of the bit lines. This enables high-speed sense amplification. Since the sub bit line is cut off, unique in-phase noise, which occurs in sense operation in sub bit lines arranged in a cross-point structure and cannot be cancelled, does not influence sense operation. As a result, the operating margin is improved by utilizing the advantage of reducing noise due to the main bit line twist to the utmost extent.

The time of turning off the bit line selection switch of the sub-memory array being accessed is not limited thereto, and may be any time between the time t2 of activating the word line and the time t3 of activating the sense amplifier. The time of turning on the bit line selection switch again, which has been once turned off, is also not limited thereto, and may be any time after the sense amplification. For example, in write operation, the bit line selection switch may be turned on when the column switch is turned off. In this case, in write inversion of the sense amplifier using data in a global data line, the capacitance of the bit line coupled to the sense amplifier, thereby enabling higher speed inversion of the sense amplifier.

Second Variation of Second Embodiment

Figure 12:
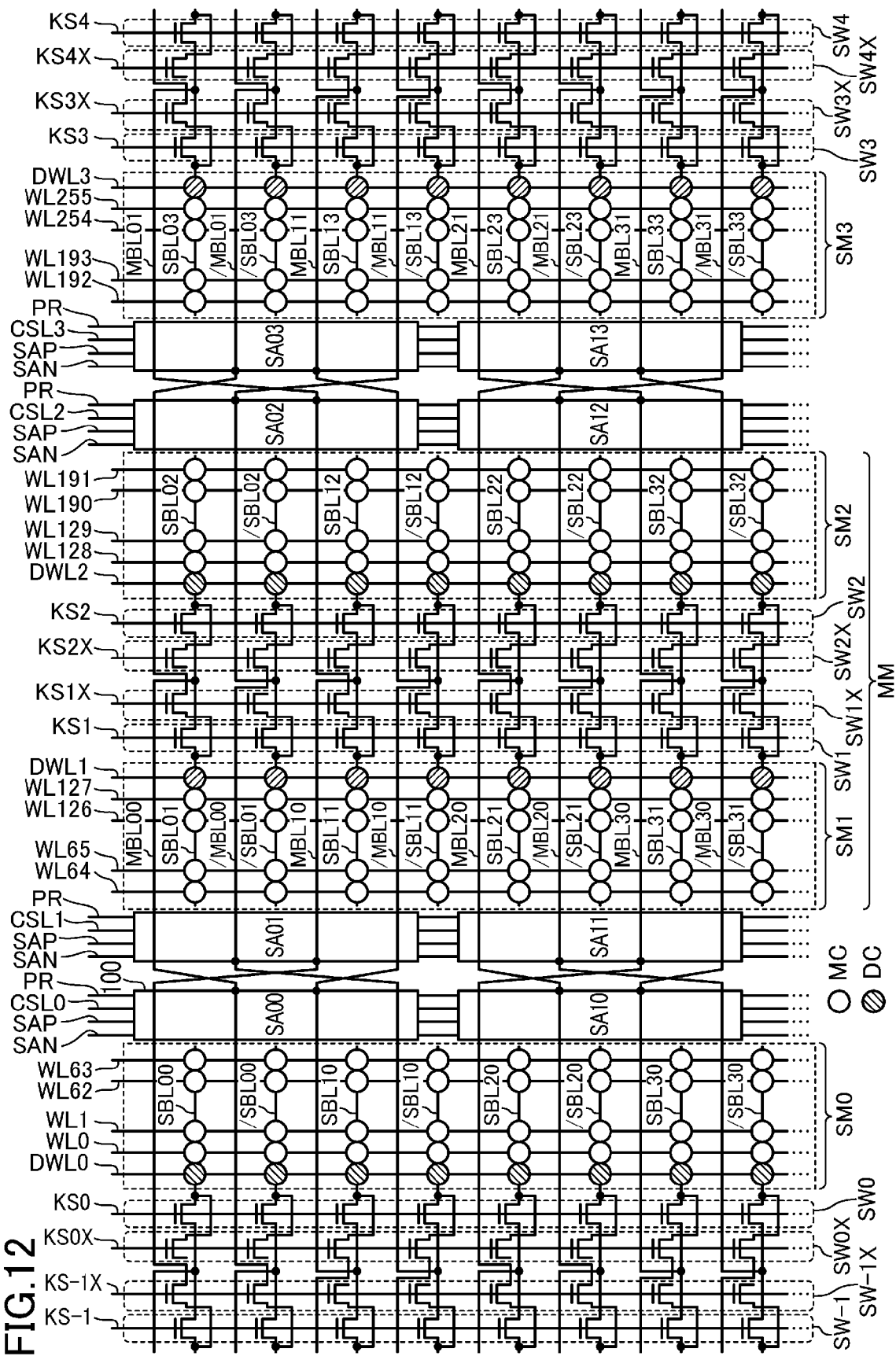
FIG. 12 is a circuit diagram of a semiconductor memory device according to a second variation of the second embodiment.

FIG. 12 illustrates the circuit configuration of a semiconductor memory device according to a second variation of the second embodiment. Different from the second embodiment shown in FIG. 9, each single main bit line is further coupled to a pair of sub bit connection switches SW-1X and SW0X, SW1X and SW2X, and SW3X and SW4X, which are controlled by sub bit line connection lines KS-1X and KS0X, KS1X and KS2X, and KS3X and KS4X.

Figure 13:
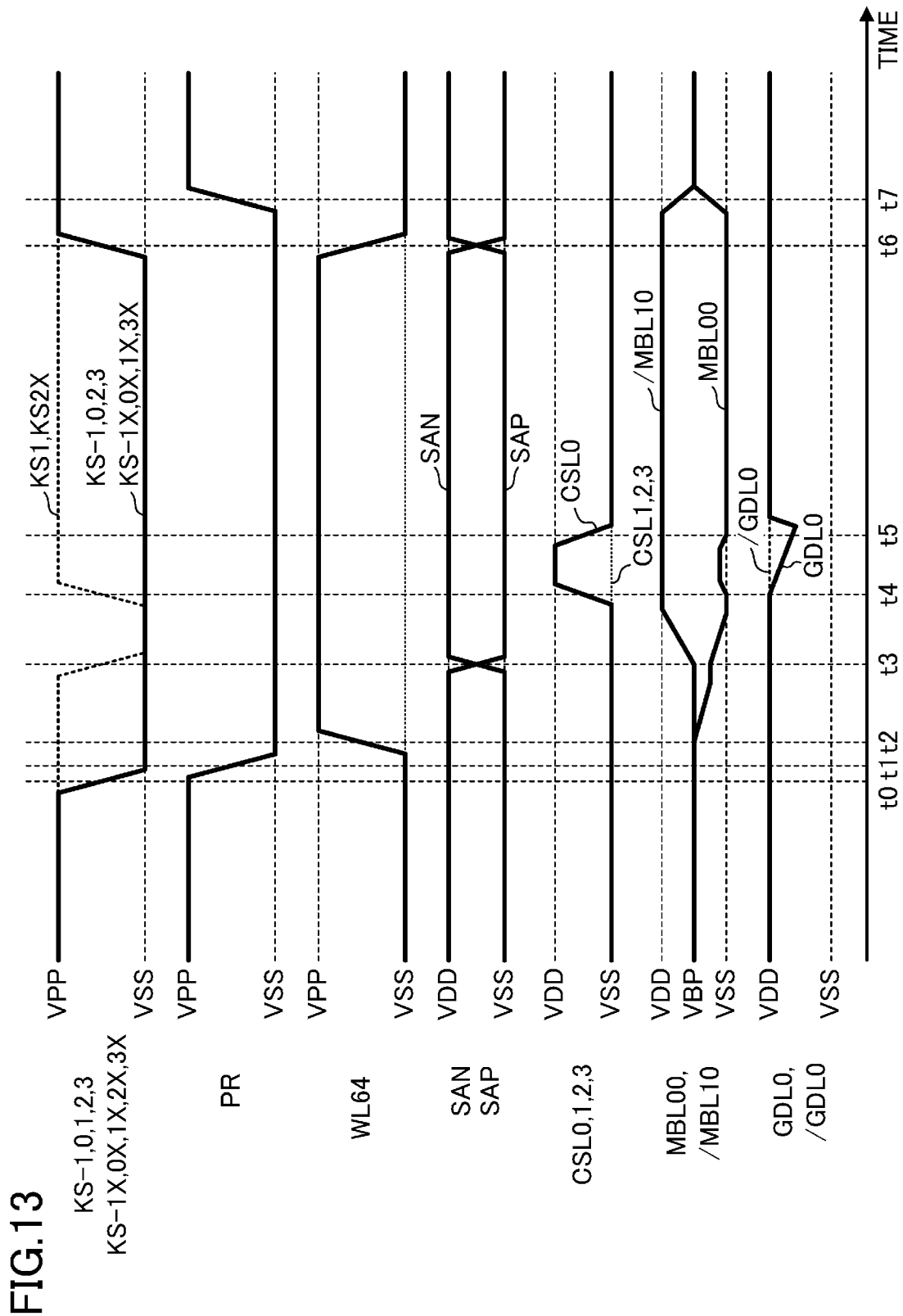
FIG. 13 illustrates timing of read operation of the semiconductor memory device of FIG. 12.

FIG. 13 illustrates the timing of a control signal according to the second variation of the second embodiment. Different from the first variation of the second embodiment shown in FIG. 11, an additional sub bit line connection line KS2X operates at the same time as the bit line selection line KS1 of the sub-memory array SM1 being accessed.

Similar to the first variation, for example, when the word line WL64 is activated, the bit line selection line KS 1 is also activated, thereby reading the signal read by the sub bit line SBL01 with the main bit line MBL00. At the same time, the sub bit line connection line KS2X is activated to couple the main bit line /MBL10 operating as a reference bit line to the sub bit line /SBL12. The bit line capacitance of the sense amplifier SA00 at the read side is equal to that at the reference side, thereby reducing interference noise between bit lines in read and sense operation by utilizing main bit line twist more effectively.

In this variation, an example has been described where the bit line selection line KS1 and the sub bit line connection line KS2X may be activated in accessing the sub-memory array SM1. In accessing the sub-memory array SM0, the bit line selection line KS0 and the sub bit line connection line KS-1X may be activated. In accessing the sub-memory array SM2, the bit line selection line KS2 and the sub bit line connection line KS1X may be activated. In accessing the sub-memory array SM3, the bit line selection line KS3 and the sub bit line connection line KS4X may be activated.

While the operation timing according to the first variation of the second embodiment has been described above, operation in the operation timing according to the second embodiment may be clearly performed as well.

Third Embodiment

Figure 14:
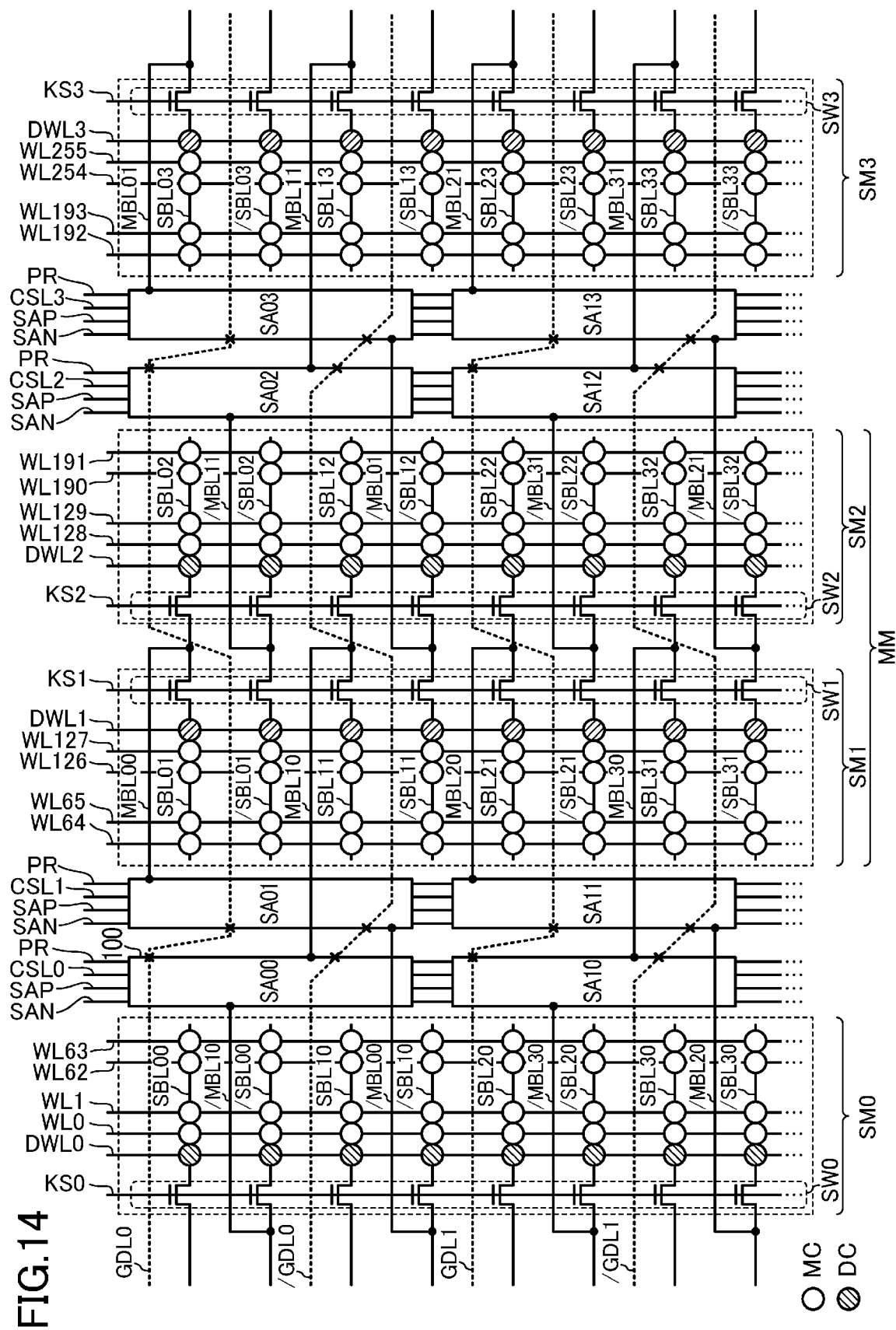
FIG. 14 is a circuit diagram of a semiconductor memory device according to a third embodiment of the present disclosure.

FIG. 14 illustrates the circuit configuration of a semiconductor memory device according to a third embodiment of the present disclosure. Different from the second embodiment shown in FIG. 9, global data lines GDL are formed in the second metal interconnect instead of the fourth metal interconnect, and adjacent to the main bit lines MBL instead of forming twist in the main bit lines MBL.

Memory operation according to this embodiment will be described with reference to FIG. 11, which illustrates the timing of control signals according to the first variation of the second embodiment. At the operation time (i.e., the time t2-t4) of the read and sense amplifiers, the global data lines GDL are fixed to a pre-charge voltage by a pre-charger (not shown), and thus servers as shields of the main bit lines MBL to provide a greater advantage of reducing the interference noise between the main bit lines than the twist structure. Furthermore, the bit line connection switch is turned off to cut off the sub bit lines SBL in the sense amplification, thereby reducing the total apparent parasitic capacitance of the bit lines. This enables high-speed sense amplification. At the same time, unique in-phase noise, which occurs in sub bit lines arranged in a cross-point structure, is cut off from the sense operation, thereby improving the operating margin.

While the operation timing according to the first variation of the second embodiment has been described above, operation may be clearly performed in the operation timing according to the second embodiment as well.

Fourth Embodiment

Figure 15:
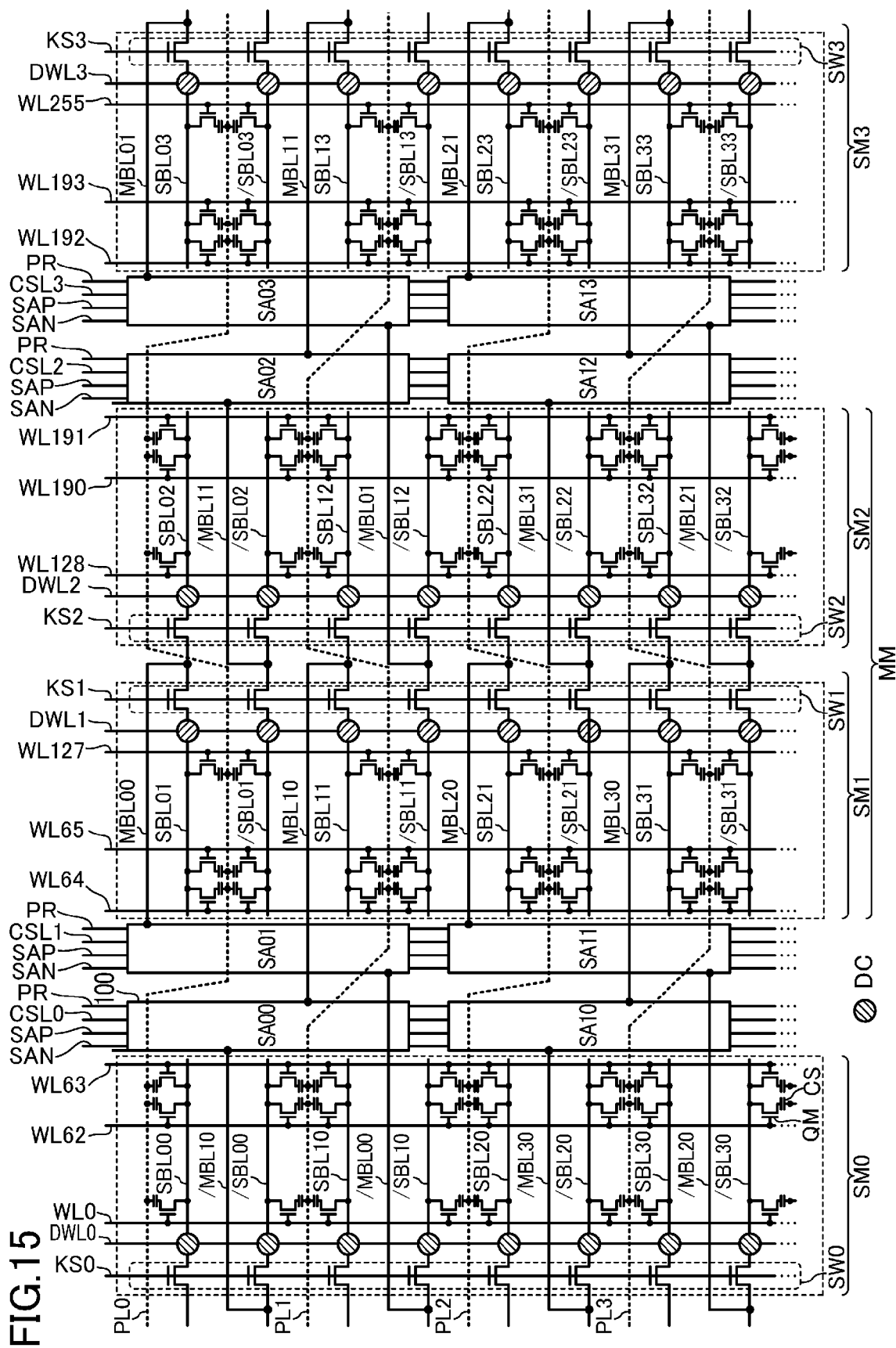
FIG. 15 is a circuit diagram of a semiconductor memory device according to a fourth embodiment of the present disclosure.

FIG. 15 illustrates the circuit configuration of a semiconductor memory device according to a fourth embodiment of the present disclosure. Different from the second embodiment shown in FIG. 9, memory cell plate shunt interconnects PL are formed in the second metal interconnect, and adjacent to the main bit lines MBL instead of forming twist in the main bit lines MBL. In addition, what is simply shown as the memory cells MC in the second embodiment for convenience is specifically shown as memory cell transistors QM and memory cell capacitors CS.

In a cross-point bit line structure, since a cell plate electrode is divided into rectangular shapes in every two word lines, the cell plate potential varies depending on a read data pattern to interfere in the read and sense operation of the bit lines. However, according to the present disclosure, cell plate electrodes are coupled in a meshed pattern by shunt interconnects PL, and thus the potential is firmly fixed, thereby reducing the interference noise. Furthermore, the memory cell plate shunt interconnects PL serve as shields between the main bit lines MBL, thereby effectively reducing the interference noise between the bit lines.

The present disclosure is not limited to the above-described embodiments and variations. Various modifications can be made within the scope of the disclosure. For example, the second variation of the second embodiment may be combined with the third or fourth embodiment.

The present disclosure is useful as a technique of providing a hierarchical bit line architecture reducing an increase in the number of interconnect layers, and reducing degradation in operating characteristics due to interference noise between main bit lines. Also, the present disclosure is useful as a technique of reducing bit line noise in a hierarchical bit line architecture of cross-point sub bit lines, thereby improving read and sense operating characteristics.

What is claimed is:

1. A semiconductor memory device having a hierarchical bit line architecture, the semiconductor memory device comprising:
    a first sub-memory array including a plurality of memory cells coupled in common to first sub bit lines in a cross-point manner;
    a second sub-memory array including a plurality of memory cells coupled in common to second sub bit lines in a cross-point manner;
    main bit lines including a first main bit line and a second main bit line, the first main bit line being coupled to one of the first sub bit lines via a first switching transistor, and the second main bit line being coupled to one of the second sub bit lines via a second switching transistor; and
    sense amplifiers including a first sense amplifier and a second sense amplifier, the first and second sense amplifiers being coupled to the main bit lines such that the main bit lines are arranged in a folded bit line structure, wherein:
    a total number of the first sub bit lines and the second sub bit lines is twice a number of the main bit lines,
    the first main bit line is connected to the first sense amplifier and extends over the second sense amplifier,
    the second main bit line is connected to the second sense amplifier and extends over the first sense amplifier,
    the first sense amplifier and the second sense amplifier are disposed in a sense amplifier region, and no memory cell is disposed in an area between the first sense amplifier and the second sense amplifier in the sense amplifier region in a plane view, and
    the first main bit line and the second main bit line are twisted in the sense amplifier region.

2. The semiconductor memory device of claim 1, wherein the main bit lines are twisted around centers of the main bit lines in a longitudinal direction.

3. The semiconductor memory device of claim 1, wherein the main bit lines are twisted in a region above the sense amplifiers.

4. The semiconductor memory device of claim 1, further comprising:
    dummy memory cells located in the first sub-memory array between the memory cells and the first switching transistors; and
    dummy memory cells located in the second sub-memory array between the memory cells and the second switching transistors.

5. The semiconductor memory device of claim 1, wherein the first and second switching transistors are controlled to be off during operation of the sense amplifiers.

6. The semiconductor memory device of claim 1, further comprising:
    sub bit line connection switch transistors, each being configured to couple one of the main bit lines extending as the reference bit line to a sub bit line in the another memory array.

7. The semiconductor memory device of claim 6, wherein the first switching transistors and the sub bit line connection switch transistors are controlled to be on during operation of the sense amplifiers.

8. A semiconductor memory device having a hierarchical bit line architecture, the semiconductor memory device comprising: a first sub-memory array including a plurality of memory cells coupled in common to first sub bit lines in a cross-point manner; a second sub-memory array including a plurality of memory cells coupled in common to second sub bit lines in a cross-point manner; main bit lines, each being coupled to one of the first sub bit lines via a first switching transistor, and to one of the second sub bit lines via a second switching transistor; sense amplifiers coupled to the main bit lines such that the main bit lines are arranged in a folded bit line structure; and memory cell plate shunt interconnects coupled in common to the memory cells in the first and second sub-memory arrays, wherein: a total number of the first sub bit lines and the second sub bit lines is twice a number of the main bit lines, one of the main bit lines extends over one of the sense amplifiers, the main bit lines and the memory cell plate shunt interconnects are alternately formed adjacent to each other in a same interconnect layer, which is higher than an interconnect layer of the first and second sub bit lines, and the memory cell plate shunt interconnects extend in a same direction as the first and second sub bit lines and the main bit lines.

9. The semiconductor memory device of claim 8, further comprising:
    dummy memory cells located in the first sub-memory array between the memory cells and the first switching transistors; and dummy memory cells located in the second sub-memory array between the memory cells and the second switching transistors.

10. The semiconductor memory device of claim 8, wherein the first and second switching transistors are controlled to be off during operation of the sense amplifiers.

* * * * *